United States Patent [19]

Hughes et al.

[11] Patent Number: 5,727,069
[45] Date of Patent: Mar. 10, 1998

[54] SOLID STATE MUSICAL INSTRUMENT AMPLIFIER WITH VACUUM TUBE SIGNAL MAGNITUDE LIMITING

[75] Inventors: William E. Hughes; Scott Clifford Hollestelle, both of Scottsdale, Ariz.

[73] Assignee: Fender Musical Instruments Corporation, Scottsdale, Ariz.

[21] Appl. No.: 182,848

[22] Filed: Jan. 14, 1994

[51] Int. Cl.[6] ............................................. H03G 3/00
[52] U.S. Cl. ................................... 381/61; 381/120
[58] Field of Search ......................... 381/61, 120, 107; 84/701, 735, 737; 330/1 R, 50, 200, 261, 267

[56] References Cited

U.S. PATENT DOCUMENTS

| | | | |
|---|---|---|---|
| 2,077,466 | 4/1937 | Dreyer et al. | 179/100.4 |
| 4,809,336 | 2/1989 | Pritchard | 381/61 |
| 5,012,199 | 4/1991 | McKale | 381/61 |
| 5,127,059 | 6/1992 | Elion et al. | 381/61 |
| 5,133,014 | 7/1992 | Pritchard | 381/61 |

OTHER PUBLICATIONS

Radiotron Desinger's Handbook, ed. F. Langford–Smith. The Wireless Press 1953.

Primary Examiner—Edward L. Coles, Sr.
Assistant Examiner—Stephen Brinich
Attorney, Agent, or Firm—Richard L. Gausewitz

[57] ABSTRACT

A musical instrument amplifier has all solid state amplification stages but incorporates a pair of vacuum tube signal magnitude limiters to provide vacuum tube type sound when the amplifier is operating in a nonlinear condition. The vacuum tubes are connected to have no supply potential so as to minimize microphonics and are each provided with a small amount of reverse bias to provide a desirable shape of the tube conduction curve and space charge suppression.

14 Claims, 1 Drawing Sheet

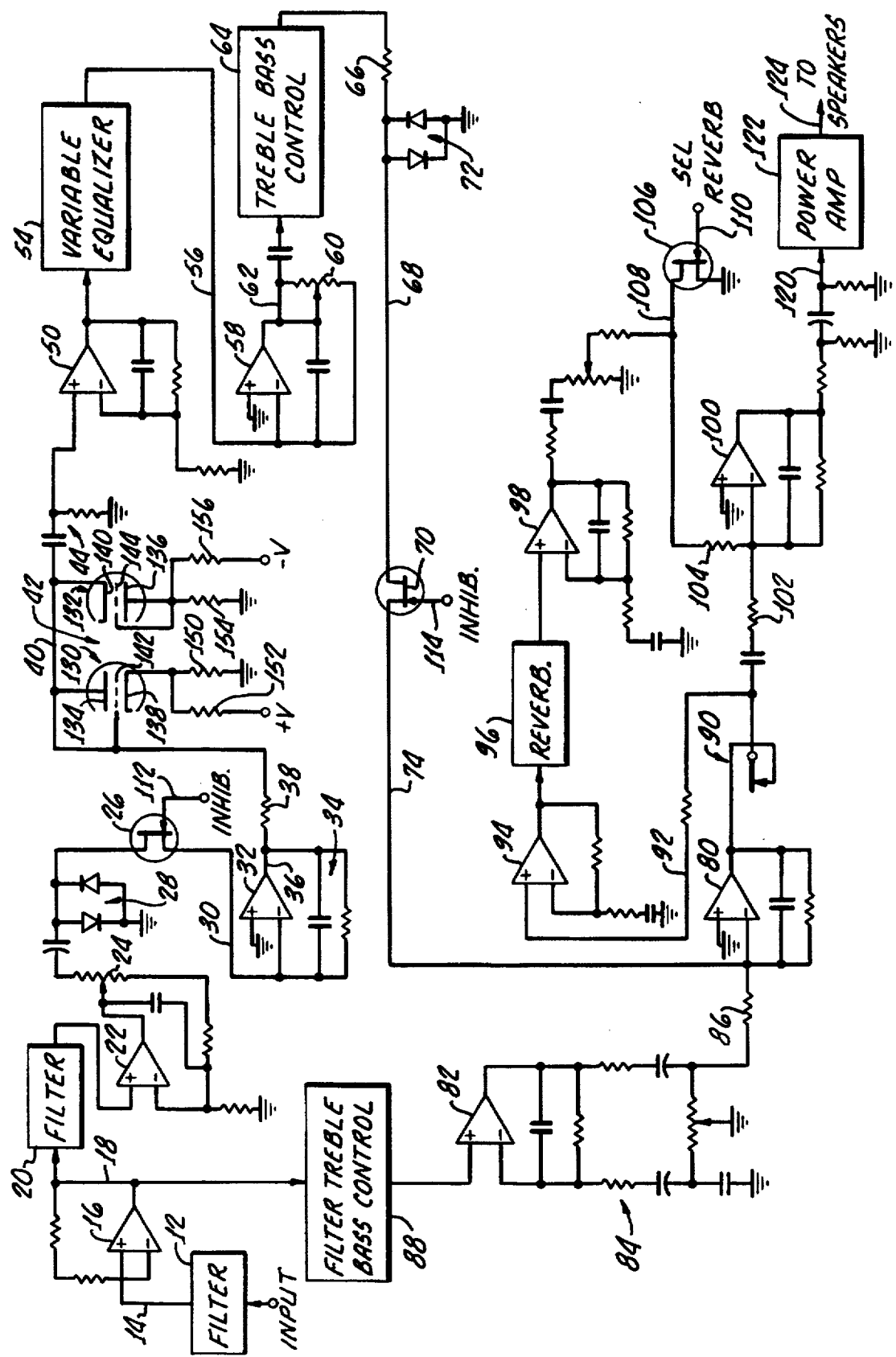

5,727,069

SOLID STATE MUSICAL INSTRUMENT AMPLIFIER WITH VACUUM TUBE SIGNAL MAGNITUDE LIMITING

BACKGROUND OF THE INVENTION

1. Field of the Invention

The present invention relates to electrical amplifiers for musical instruments (musical instrument amplifiers), and more particularly concerns an amplifier that exhibits improved nonlinear operation.

2. Description of Related Art

Despite the well known benefits of solid state components, amplifiers using vacuum tube amplification stages are still used, and preferred by many musicians, particularly for the unique sound produced by vacuum tubes operating in a distortion or nonlinear region. However, some amplifiers for musical instruments, such as those designed for electric bass instruments for example, are seldom driven into nonlinear operation, so that sound characteristics during nonlinear operation are of little consequence. Therefore, such linear operation amplifiers may readily take advantage of the many advantages of all solid state construction with little compromise of desirable characteristics. It is well known of course, that solid state amplifiers have many advantages, including the fact that they are more reliable than tube type amplifiers, cheaper, lighter and simpler to handle on a production line. Nevertheless, a number of amplifiers, such as those designed for operation with an electric guitar, are frequently driven into nonlinear operation during a normal performance. Sound characteristics of such instruments during nonlinear operation are of great significance to the musician. In the solid state amplifier, performance during nonlinear operation is controlled by solid state clipping diodes having conduction characteristics that provide the distorted sound of nonlinear operation. This distorted, nonlinear sound in an all solid state amplifier is not desired or acceptable to some musicians, and accordingly vacuum tube amplifiers are often used by those who prefer the sound of tubes in nonlinear operation. In the vacuum tube amplifier, circuitry is arranged to cause the amplifying vacuum tubes to be overdriven at times so that the nonlinear operation effectively occurs in overdriven vacuum tube amplifier stages. Sound of such overdriven vacuum tubes is greatly preferred by some musicians who are thus willing to forego the advantages of a solid state amplifier in order to obtain the preferred tube type nonlinear operation. Therefore, the musician must make a choice between desired tube sound and advantages of solid state components.

Accordingly, it is an object of the present invention to eliminate the need for such a choice and to provide a musical instrument amplifier having the advantages of a solid state amplifier with output that provides the overdriven sound of a tube amplifier.

SUMMARY OF THE INVENTION

In carrying out principles of the present invention an amplifier has a plurality of solid state stages, and a vacuum tube signal magnitude limiter is connected to the output of one of the amplifier stages. The tube limiter includes oppositely poled vacuum tubes that are connected to have no supply potential. In a preferred arrangement a reverse bias is applied to each tube to suppress space charge.

BRIEF DESCRIPTION OF THE DRAWINGS

The single sheet of drawing shows a somewhat simplified circuit of a solid state musical instrument amplifier incorporating vacuum tube signal magnitude limiters.

DETAILED DESCRIPTION OF THE PREFERRED EMBODIMENTS

The single FIGURE of drawings shows a simplified circuit of an exemplary solid state electric guitar amplifier that incorporates a vacuum tube signal magnitude limiter in order to obtain the much preferred tube type sound when the amplifier operates in a nonlinear or distortion mode. The amplifier is completely made of solid state components (e.g. transistors and related circuits formed as integrated circuits), except for the single vacuum tube (a dual triode in a single envelope) connected to the output of one of the solid state amplifying stages.

Signal input is provided on a line 10 through a filter 12 that generally rejects low levels beyond the range of the guitar. The filtered signal is fed via a line 14 to the noninverting input of a first solid state operational amplifier 16. This amplifier, and all of the other operational amplifiers employed in the circuit, is one half of a solid state TL072 chip made by and available from both Texas Instruments and Motorola. These amplifiers are available on an integrated circuit chip, with two such amplifiers being formed on a single chip.

The output of amplifier 16, on a line 18, is fed through a second filter 20, which basically provides a type of equalization in rejecting a selected band of mid-range frequencies. Filter 20 provides the signal to the noninverting input of a second operational amplifier stage 22 that provides a small amount of gain. The output of this amplifier is fed through a level control potentiometer 24 and through a field effect transistor (FET) 26 which operates as an on/off inhibit switch to inhibit the signal output of amplifier stage 22. A pair of oppositely poled diodes 28 are provided to limit signal applied to the FET switch so that no signal will be passed by the switch when it is in off condition. The signal from the switch is fed via a line 30 to the inverting input of an operational amplifier stage 32, which has a gain in the order of about 30. Because of the negative feedback from the output of amplifier 32 to its inverting input, via the parallel resistor capacitor network 34, the DC potential at the amplifier output, at point 36, is zero. The audio signal from the output of amplifier 32 is fed through a resistor 38 to a line 40.

A vacuum tube signal magnitude limiter, generally indicated at 42, is connected between line 40 and ground. Details of the signal limiter will be described hereinafter.

The signal on line 40 is fed through a resistor capacitor network 44 to the noninverting input of an operational amplifier stage 50 that provides a gain of about 7. The output of this amplifier is fed to a variable equalizer circuit 54, which, like the filter 20 at the input to amplifier 22, rejects a small band of mid-range frequencies, with such band preferably being adjustably selectable by the operator.

From equalizer 54 the audio signal is fed via a line 56 to the inverting input of an amplifier stage 58, which includes in its negative feedback loop a volume control potentiometer 60. The output of amplifier 58 is fed via a line 62 to a treble and bass control circuit 64 from which the output is fed via a resistor 66 and a line 68 through an on/off FET switch 70 that is used to inhibit the output on line 68. A pair of oppositely poled diodes 72 connected to line 68 limits the amount of signal passed to the switch from the treble and bass control. From the switch 70 the signal is fed via a line 74 to the inverting input of an operational amplifier stage 80, which also receives the output of an operational amplifier stage 82, which is fed to the inverting input of amplifier 80 via a filter 84 and a summing resistor 86.

Amplifier stage 82 receives a signal at its noninverting input from the output of a treble and bass control filter 88, which in turn receives an input from the output of the first or input amplifier stage 16. The output of amplifier 82 is selectively inhibited by an additional on/off FET switch (not shown) which operates alternatively with FET switch 70 so that only one or the other of signals from amplifiers 58 and 82 is fed to amplifier 80.

The output of amplifier 80, which combines the signal in the two signal paths, namely that from treble and bass control 88 and amplifier 82, on the one hand, and that from the upper channel including amplifying stages 22, 32, 50, 58 and treble and bass control 64 on the other hand, is fed through a jack, generally indicated at 90. The jack is utilized to connect to and from special effects external equipment, such as an external reverberation circuit or an external equalization circuit (not shown). The audio signal is fed through the jack and thence, via a line 92, to the noninverting input of an operational amplifier 94, which feeds an internal reverberation circuit 96, of which the output is sent to the noninverting input of an operational amplifier stage 98.

If the signal from amplifier stage 80 is fed to some type of special effects loop via jack 90 (in which case the jack 90 will have additional terminals in addition to those illustrated), the external special effects circuit loop returns its processed signal from the jack to be summed at the input of amplifier 94 in the place of the signal on line 92 from the output of amplifier stage 80. Thus the signal input to stage 94 is switched by the jack, between the external special effects loop (not shown) and the output of amplifier stage 80.

The output of amplifier stage 98 is summed with the output of amplifier stage 80, which is fed through jack 90, at the inverting input terminal of an operational amplifier stage 100 in a summing network comprising resistors 102 and 104. An additional on/off switch in the form of a FET 106 is connected to a line 108 from the output of amplification stage 98, which passes the internal reverberation signal to the input of amplifier stage 100. A control line 110 of the FET switch 106 is employed to select or deselect internal reverberation. Similarly, control lines 112,114 are provided to turn inhibit switches 26 and 70 on or off as desired.

From the output of amplifier stage 100 the audio signal is fed, via a line 120, to an output or power amplifier 122 (also solid state, including an MC1436 chip and a pair of oppositely poled transistors, T1P142 and T1P147, not shown). From the outputs of the amplifier a pair of signals on lines collectively indicated at 124 are fed to the system speakers.

As mentioned above, the signal channel, including filter 20, amplifier stages 22 and 32, feeds the signal, via a line 40, to an amplifier stage 50. To this line 40, between the output of stage 32 and the input of stage 50, is connected a vacuum tube signal magnitude limiter 42 that embodies principles of the present invention. The limiter comprises first and second oppositely poled triodes 130 and 132, each including a plate electrode 134,136, a cathode electrode 138,140, and a grid electrode 142,144. Each triode has its plate 134,136 connected directly to its grid 142,144. Suitable heating circuitry (not shown) for the filaments (not shown) of each of the two triodes is provided in a conventional fashion. Obviously pentodes or other multi-element vacuum tubes may be substituted for the triodes.

A reverse bias is provided for each of the vacuum tubes. For tube 130 a positive bias, in the order of about +2 volts, is provided by connecting cathode 138 to ground via a resistor 150 and applying a voltage source, such as, for example +16 volts, via a resistor 152 to the cathode. The magnitudes of resistors 150 and 152 are selected to provide a potential of approximately +2 volts on the cathode 138. Similarly, plate 136 is provided with a negative bias potential of about −2 volts by connecting the plate to ground through a resistor 154 and applying a negative potential, in the order of about −16 volts, via a resistor 156 to the plate 136. Again, the values of the resistors 154 and 156 are chosen to provide a reverse bias potential of about −2 volts on the plate 136. The magnitude of the reverse biases may be changed as desired to obtain a different distortion sound.

Importantly, as can be seen from the circuit and the above description of the circuit connections, the two vacuum tube triodes are connected to have no supply potential and to have zero gain. As previously mentioned, the high gain amplifier stage 32, to the output of which the tube signal limiters are connected, has a negative feedback sufficiently large to maintain a substantially zero volt DC potential at the amplifier output terminal 36. Thus, line 40, connected to the plate 134 and cathode 140 of the triodes, has substantially zero DC potential.

In normal operation a heated cathode of a vacuum tube discharges a number of free electrons, which provides a space charge as a cloud of free electrons in the vicinity of the cathode, where the electrons remain in the absence of any DC potential on the plate. The described reverse bias eliminates this space charge so that the triode limiters now have an appropriate conduction curve and a useful forward conduction threshold.

In linear operation the audio signal at the output of amplifier stage 32 has positive and negative peaks, neither of which is of sufficient magnitude to cause the reversely biased vacuum tube triodes to conduct. Therefore, the circuit operates just as if the vacuum tubes were not present. In this linear portion of the circuit operation the vacuum tubes 130,132 play no part. They do not conduct. They do not affect the signal, and, importantly, they can exhibit no microphonics because they have no potential applied.

Microphonic characteristics of a vacuum tube are well known as causing a major problem with vacuum tubes. Microphonic characteristics effectively cause the vacuum tubes to operate as a signal source. For example, if an amplifying vacuum tube has its envelope physically tapped, noise is generated by the tube because the tube behaves as a microphone. It behaves as a condenser microphone because the electrodes are polarized and exhibit an interelectrode capacity that varies as the electrodes move. However, without any applied supply potential, current does not flow through the vacuum tubes and, therefore, they can exhibit no microphonics in ordinary linear operation of the amplifier. In the described arrangement microphonics of the triodes 130,132 are eliminated in part because there is no significant potential between the electrodes of either of the tubes.

By applying reverse bias, each of the triodes is provided with a forward conduction threshold, and thus with a conduction versus impedance curve that causes the resulting sound to have the desired vacuum tube effect when the amplifier operates under nonlinear or distortion conditions.

As the positive going portion of an audio signal, at the output of amplifier stage 32, rises to a value above the reverse bias of vacuum tube 130, the latter begins to conduct, and thus provides a constraint or limitation on increase of magnitude of the positive going peak via a conduction curve unique to the triode. Similarly, when the negative going peak of the audio signal on line 40 goes below the reverse bias of tube 132, the latter begins to conduct, with its unique vacuum tube current versus impedance curve shape.

Thus, the presence of the dual oppositely poled vacuum tube triodes, connected as a signal magnitude limiter to the output of amplifier stage 32, provides a unique tube type distortion sound when the amplifier operates at a level above its linear range. With the amplifier operating in its linear range, however, the vacuum tubes provide no effect on the circuit and exhibit no microphonics. Thus, the described amplifier exhibits desirable characteristics of both solid state and vacuum circuits. In a presently preferred embodiment, the entire amplifier, except for the vacuum tube signal magnitude limiter, is made of solid state (integrated circuit) components, with all the advantages of such solid state components. At the same time nonlinear operation is controlled by the vacuum tubes to provide the nonlinear vacuum tube distortion sound.

Although advantages of the described vacuum tube limiter are maximized by use of the limiter in an amplifier having all solid state amplifier stages, it will be readily appreciated that this tube limiter also may be used in an amplifier having one or more vacuum tube amplifying stages, with the described limiter connected to the output of one of the tube amplifier stages. If the amplifier has both solid state and tube amplifier stages, the described tube limiter can be connected to the output of either a solid state or tube amplifier stage.

In a presently preferred example the vacuum tubes are provided as twin triodes in a single envelope in a 12AX7 type tube. Of course separate envelopes or other types of tubes, such as pentodes, may be employed as an alternative.

Although the vacuum tube signal magnitude limiting circuit has been shown in connection with a specific solid state amplifier, it will be readily appreciated that this signal magnitude limiter can be used with any type of solid state amplifier where tube type distortion sound is desired for nonlinear operation.

The magnitudes of the reverse bias on the two triodes may be the same for each of the triodes, in which case only odd order harmonics are generated when the tubes conduct in the nonlinear range of the amplifier. Stated otherwise, with a sinusoidal input to the limiter and equal reverse bias on the two tubes, only odd order harmonics are generated. However, if different magnitude biases are employed on the two tubes, a sinusoidal input on line 40 will produce not only odd order harmonics but also even order harmonics, which will markedly change the sound of the amplifier as used by the musician.

There has been described a unique, simple signal magnitude limiter which provides a fully solid state amplifier with a nonlinear tube sound. This is achieved by connecting a pair of vacuum tube signal limiters to the output of one of the solid state stages of the amplifier and connecting the vacuum tubes to have no supply potential. An appropriate small reverse bias is applied to the tubes to obtain the desired conduction versus impedance curve. Connected this way, of course, the vacuum tubes have zero gain and have no effect on the amplifier in its linear operation.

In an alternative configuration, one or more of the solid state stages is replaced by one or more vacuum tube amplifier stages. Again the described tube limiter is connected to the output of one of the amplifying stages.

We claim:

1. A musical instrument amplifier comprising:
   a solid state amplifier having a plurality of solid state stages, and
   a vacuum tube signal limiter connected to the output of a predetermined one of said solid state stages, said vacuum tube signal limiter comprising:
      first and second oppositely poled vacuum tubes each having a plate electrode, a grid and a cathode electrode, and
      means to electrically connect said vacuum tubes to cause them to act as a signal magnitude limiter to the output of said predetermined one of said solid state stages, and to provide a type of distortion characteristic of vacuum-tube amplifiers when the musical instrument amplifier operates at a level above its linear range, to thereby provide a tube-type distortion sound when the amplifier operates at a level above its linear range.

2. The musical instrument amplifier of claim 1 wherein the output of said predetermined one of said solid state stages is connected to have zero DC potential and is coupled to said vacuum tubes.

3. The musical instrument amplifier of claim 1 wherein said plate electrode of each of said vacuum tubes is connected to its associated grid.

4. The musical instrument amplifier of claim 3 including means for applying reverse bias to each of said vacuum tubes to suppress space charge.

5. The musical instrument amplifier of claim 1 wherein each of said vacuum tubes is connected to have zero gain, and wherein both of said vacuum tubes are connected to have no significant potential between their electrodes.

6. A musical instrument amplifier comprising:
   a solid state amplifier having a plurality of solid state stages,
   a vacuum tube signal limiter connected to the output of a predetermined one of said solid state stages, said vacuum tube signal limiter comprising:
      first and second oppositely poled vacuum tubes each having a plate electrode, a grid and a cathode electrode,
      both of said vacuum tubes being connected to have no significant potential between their electrodes, the plate of each of said vacuum tubes being connected to its grid, and
   means for applying reverse bias to each of said vacuum tubes to suppress space charge,
      said means for applying reverse bias including means for applying equal magnitudes of reverse bias to both of said vacuum tubes.

7. A musical instrument amplifier comprising:
   a solid state amplifier having a plurality of solid state stages,
   a vacuum tube signal limiter connected to the output of a predetermined one of said solid state stages, said vacuum tube signal limiter comprising:
      first and second oppositely poled vacuum tubes each having a plate electrode, a grid and a cathode electrode,
      both of said vacuum tubes being connected to have no significant potential between their electrodes,
      the plate of each of said vacuum tubes being connected to its grid, and
   means for applying reverse bias to each of said vacuum tubes to suppress space charge, said means for applying reverse bias including means for applying unequal magnitudes of reverse bias to both of said vacuum tubes.

8. A musical instrument amplifier comprising:
a solid state amplifier having a plurality of solid state stages,
a vacuum tube signal limiter connected to the output of a predetermined one of said solid state stages, said vacuum tube signal limiter comprising:
first and second oppositely poled vacuum tubes each having a plate electrode, a grid and a cathode electrode, and
both of said vacuum tubes being connected to have no significant potential between their electrodes, the plate of each of said vacuum tubes being connected to its grid, and
means for applying reverse bias to each of said vacuum tubes to suppress space charge,
wherein both of said vacuum tubes are in a single common envelope.

9. A musical instrument amplifier comprising:
a solid state amplifier having a plurality of solid state stages,
a vacuum tube signal limiter connected to the output of a predetermined one of said solid state stages, said vacuum tube signal limiter comprising:
first and second oppositely poled vacuum tubes each having a plate electrode, a grid and a cathode electrode, and
both of said vacuum tubes being connected to have no significant potential between their electrodes, the plate of each of said vacuum tubes being connected to its grid, and
means for applying reverse bias to each of said vacuum tubes to suppress space charge,
wherein each of said vacuum tubes is in a separate envelope.

10. A musical instrument amplifier comprising:
a solid state amplifier having a plurality of solid state stages, and
a vacuum tube signal limiter connected to the output of one of said solid state stages, said vacuum tube signal limiter comprising:
first and second oppositely poled vacuum tubes each having a plate, a grid and a cathode, each of said vacuum tubes having its plate connected to its grid, and
means for applying reverse bias to each of said vacuum tubes to suppress space charge,
each of said vacuum tubes having applied supply potential that causes substantially no potential from its plate to its cathode, whereby current does not flow throuqh said vacuum tubes and they exhibit no microphonics.

11. A musical instrument amplifier comprising:
a solid state amplifier having a solid state amplifying stage, said amplifying stage having an output and being connected to have substantially zero DC potential at said output,
first and second vacuum tubes connected to said solid state amplifier stage output, each said vacuum tube having cathode, grid and plate electrodes, said plate electrode of said first vacuum tube and said cathode electrode of said second vacuum tube being connected to said solid state amplifier stage output, said cathode electrode of said first vacuum tube and said plate electrode of said second vacuum tube being connected to ground, the grid and plate electrodes of each of said vacuum tubes being connected to one another, and
means for applying reverse bias to the cathode of said first vacuum tube and the plate of said second vacuum tube.

12. A musical instrument amplifier comprising:
an amplifier having a plurality of amplifying stages,
a vacuum tube signal limiter connected to the output of one of said amplifying stages, said vacuum tube signal limiter comprising:
first and second oppositely poled vacuum tubes each having a plate electrode, a grid electrode and a cathode electrode, and
both of said vacuum tubes being connected to have no significant potential between their electrodes,
the plate electrode of each of said vacuum tubes being connected to its grid electrode, and
means for applying reverse bias to each of said vacuum tubes to suppress space charge.

13. A musical instrument amplifier, which comprises:
an amplifier having a plurality of solid state amplifying stages,
a vacuum tube signal magnitude limiter incorporating tube means, and
means to connect said vacuum tube signal magnitude limiter to the output of one of said solid state stages, and to connect said vacuum tube signal magnitude limiter in such manner that said amplifier is substantially unaffected by said vacuum tube signal magnitude limiter during periods when said amplifier is operating in its linear range, and also in such manner that vacuum tube-type distortion is achieved during periods when said amplifier is operating at a level above its linear range,
thereby achieving benefits of both solid state amplifiers and vacuum tube amplifiers.

14. The musical instrument amplifier of claim 13 wherein means are provided to apply reverse bias to said vacuum tube means of said vacuum tube signal magnitude limiter.

* * * * *